US006198360B1

(12) United States Patent
Henrion

(10) Patent No.: US 6,198,360 B1
(45) Date of Patent: Mar. 6, 2001

(54) QUADRATURE CURRENT FREQUENCY MODULATION OSCILLATOR

(75) Inventor: W. S. Henrion, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/347,829

(22) Filed: Jul. 2, 1999

Related U.S. Application Data
(60) Provisional application No. 60/104,486, filed on Oct. 16, 1998.

(51) Int. Cl.[7] .................................................. H03B 1/00
(52) U.S. Cl. ........................................ 331/177 R; 331/167
(58) Field of Search ........................... 331/117 R, 117 FE, 331/167, 168, 177 R

(56) References Cited

U.S. PATENT DOCUMENTS

| | | | |
|---|---|---|---|
| 4,061,987 | * 12/1977 | Nagahama | 331/111 |
| 4,492,934 | * 1/1985 | Sugimoto | 331/117 R |
| 4,588,968 | * 5/1986 | Wile | 331/109 |
| 5,418,497 | * 5/1995 | Martin | 331/48 |

* cited by examiner

Primary Examiner—Robert Pascal
Assistant Examiner—Henry Choe
(74) Attorney, Agent, or Firm—Christopher P. Maiorana, P.C.

(57) ABSTRACT

A circuit and method used in LC or ring oscillators. The present invention may modulate the frequency of oscillation by detecting a quadrature signal and controlling the sign and magnitude of the quadrature signal that may be feedback to the oscillator to cause the oscillator to run either faster or slower (dependent on the sign of the quadrature signal) than the unmodulated oscillator.

20 Claims, 3 Drawing Sheets

QUADRATURE CURRENT FREQUENCY MODULATION OSCILLATOR

This application claims the benefit of provisional application Ser. No. 60/104,486 filed Oct. 16, 1998, which is hereby incorporated by reference in its entirety.

FIELD OF THE INVENTION

The present invention relates to oscillators generally and, more particularly, to a quadrature current frequency modulation oscillator.

BACKGROUND OF THE INVENTION

Oscillators are used in a variety of design applications. One type of oscillator is a inductor/capacitor (LC) oscillator. In the case of an LC oscillator, one conventional method used to change the frequency of the oscillator is to implement a variable junction capacitor to change the resonant frequency of the LC circuit.

A disadvantage with adjusting the frequency of LC oscillators using variable junction capacitors to change the resonant frequency is the accuracy problems introduced when fabricating variable junction capacitors. Furthermore, low loss junction capacitances may not be convenient to fabricate in every process technology. The modulation is non-linear over the limited range that can be achieved.

Another type of oscillator is a ring oscillator. In the case of a ring oscillator, one conventional method used to change the frequency of the modulation of the oscillator is to vary the internal delay of the oscillator. Adjusting, either the resistance (R) or the capacitance (C) of the gain stages varies the delay. Another approach to varying the delay is to implement two delay paths and to change the proportion of the signal through the two different paths.

A disadvantage with the use of ring oscillators may occur when built using processes, that has a relatively high variation of parameters due to variations in processing. As result, such oscillators may require large modulation ranges to compensate for such process variations.

Another type of oscillator is an integrated relaxation oscillator. Integrated relaxation oscillators are not widely used because of the need to either (i) provide accurate absolute value resistors or absolute value charging currents. Integrated relaxation oscillators may be susceptible to undesirable amounts of phase noise.

SUMMARY OF THE INVENTION

The present invention concerns a circuit and method used in LC or ring oscillators. The present invention may modulate the frequency of oscillation by detecting a quadrature signal and controlling the sign and magnitude of the quadrature signal that may be feedback to the oscillator to cause the oscillator to run either faster or slower (dependent on the sign of the quadrature signal) than the unmodulated oscillator.

In one example, the quadrature currents in the reactive components are sensed across one or more series resistors. These quadrature voltages are feedback through complementary differential gain (e.g., $g_m$) amplifiers, whose differential gain gm is controlled by the modulation voltage or differential amplifiers whose gains are controlled by the modulation voltage and their outputs are summed to vary the magnitude and phase of the quadrature modulation current.

The objects, features and advantages of the present invention include providing an LC oscillator that (i) is relatively stable, (ii) reduces sensitivity to process variations, (iii) has a low phase noise, (iv) uses a reduced or minimum amount of power, (v) has a relative stable modulation sensitivity over temperature and process variations, and/or (vi) has a linear relationship between the modulation voltage and the frequency.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may provide a circuit and method configured to frequency modulate an oscillator without having to change the timing components (e.g., resistors, inductors and capacitors). An oscillator that has fixed timing components can be frequency modulated that may allow the use of the most stable passive timing elements available.

Figure 1:
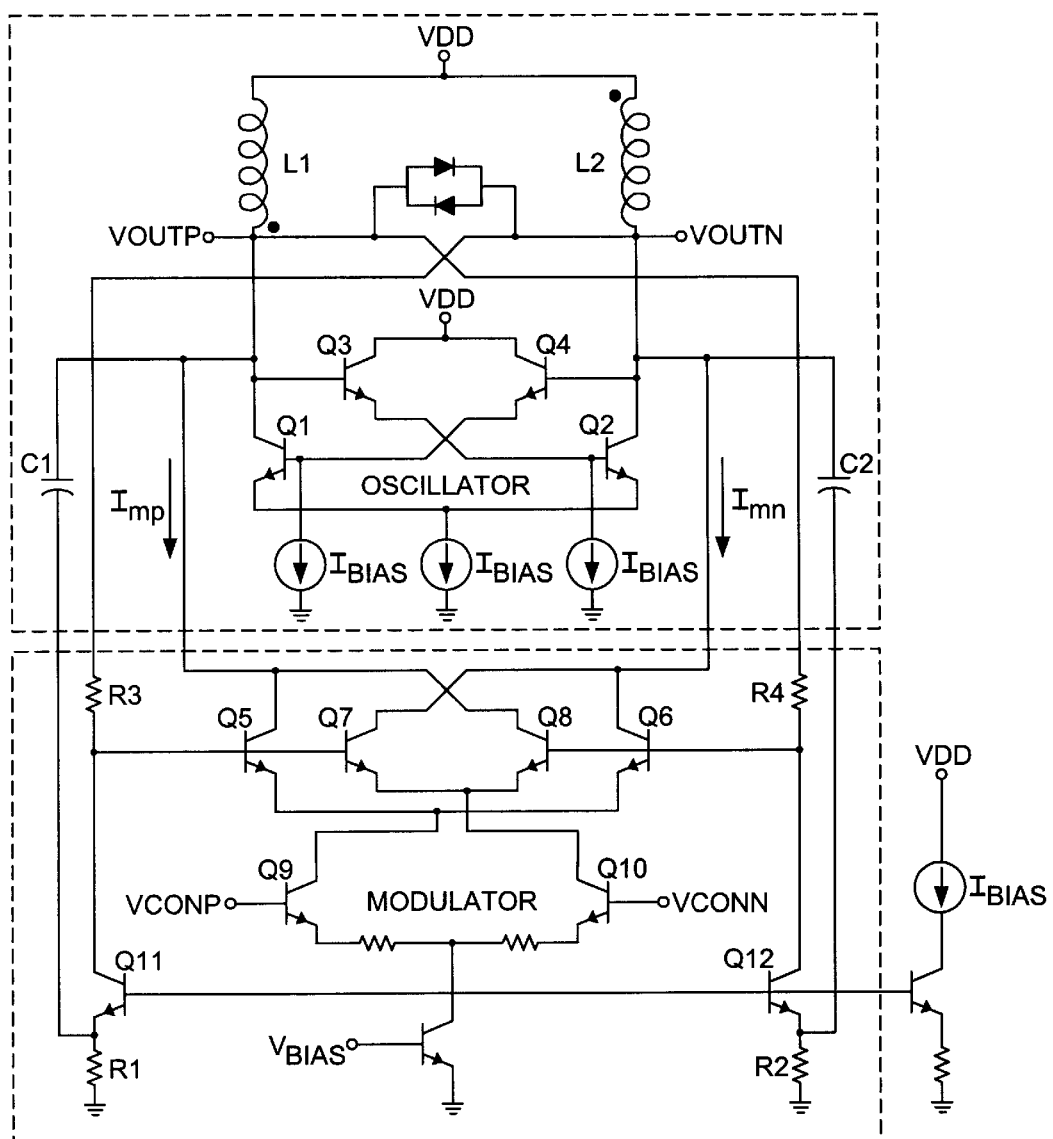
FIG. 1 is a diagram of a preferred embodiment of the present invention.

Referring to FIG. 1, an oscillator 10 is shown that may be implemented as a LC oscillator. The inductors L1 and L2 may be, in one example, 4.9 nH inductors. The capacitors C1 and C2 may be, in one example, 0.305 pF capacitors. However, other values for the capacitors C1 and C2 and the inductors L1 and L2 may be used to meet the design criteria of a particular application. The capacitors C1 and C2 may be connected to ground through the resistors R1 and R2. The resistors R1 and R2 may be 4 ohm resistors. However, other values for the resistors R1 and R2 may be used to meet the design criteria of a particular application.

The voltage developed across the resistors R1 and R2 is generally proportional to the current in the capacitors C1 and C2. These voltages are in quadrature (e.g., +/−90°) with respect to the voltage across the tuned circuit VOUTP and VOUTN and 180° out of phase with respect to each other. These voltages are applied to two simple common base amplifier stages Q11 and Q12 whose outputs are coupled to two cross coupled differential amplifiers (e.g., the transistors Q5–Q6 and the transistors Q7–Q8).

The voltages VCONP and VCONN may be control voltages (or control signals) that may adjust the frequency of the oscillator. For a case when the voltage VCONP equals the voltage VCONN the differential amplifier transistors Q7 and Q8 may have the same gain as the differential amplifier transistors Q5 and Q6. The net current out of the cross coupled collectors (shown as Imp and Imn) is zero and therefore may have no effect on the frequency of oscillation. If the voltage VCONP is greater than (e.g., more positive) the voltage VCONN, the gain of the Q5–Q6 amplifier may be greater than the gain of the amplifier Q7–Q8. This may result in a current in Imp and Imn that opposes the change in voltage VOUTP and VOUTN (e.g., tank voltages) which generally causes the frequency of oscillation to decrease. If the voltage VCONN is greater than the voltage VCONP, the Q7–Q8 amplifier may have the higher gain and the currents out of the collectors Imp and Imn may be in a direction that aids the change in the voltages VOUTP and VOUTN, which may thereby increase the frequency of oscillation.

The resistors R3 and R4 may correct phase errors due to the resistors R1 and R2 causing the current through the capacitors to not be exactly 90 degrees out phase with respect to the tank node voltages VOUTP and VOUTN. The delay of the feedback signal, through the feedback, amplifier may also be corrected by the resistors R3 and R4.

Figure 2:
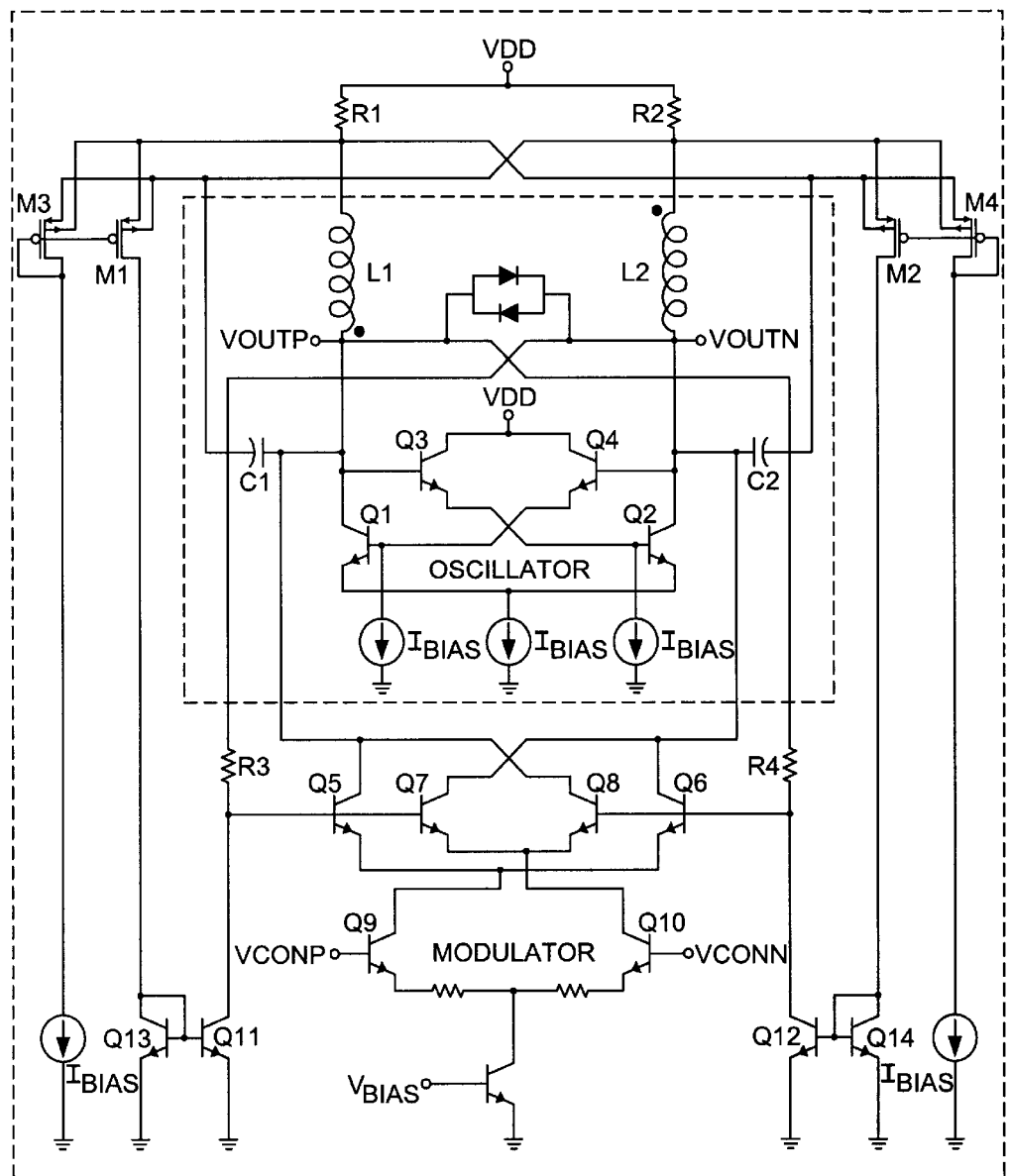
FIG. 2 is a wide band (large modulation range) alternate embodiment of the present invention.

FIG. 2 shows a variation of this invention intended for wide band applications. The changes to the VCO of FIG. 1 is the addition of the quadrature modulation currents being derived not only from the current in the capacitors C1 and C2, but also the currents in the inductors L1 and L2. The p-channel MOS transistors M1, M2, M3 and M4 may operate as differential input $g_m$ amplifiers to amplify the signals derived from the inductors L1 and L2 summed with the currents from the capacitors C1 and C2 in the resistors R1 and R2. The outputs of the transistors M1 and M2 may be mirrored through the bipolar transistors Q11 and Q13 and the transistors Q12 and Q14. The operation of the modulation is the same as that described for FIG. 1, with the additional signal from the inductor currents. The result of summing these signals is that the quadrature current used to modulate the oscillator is relatively constant over a broad range of frequencies. By proper selection of the ratio of the inductive and capacitive derived quadrature current, optimum linearity may be obtained for any given range of modulation. This selection of ratios of inductive to capacitive current may easily be done by splitting the capacitors C1 and C2 into two pieces. Part of the capacitive current may go through the resistors R1 and R2 and part may go to ground (or Vdd).

Figure 3:
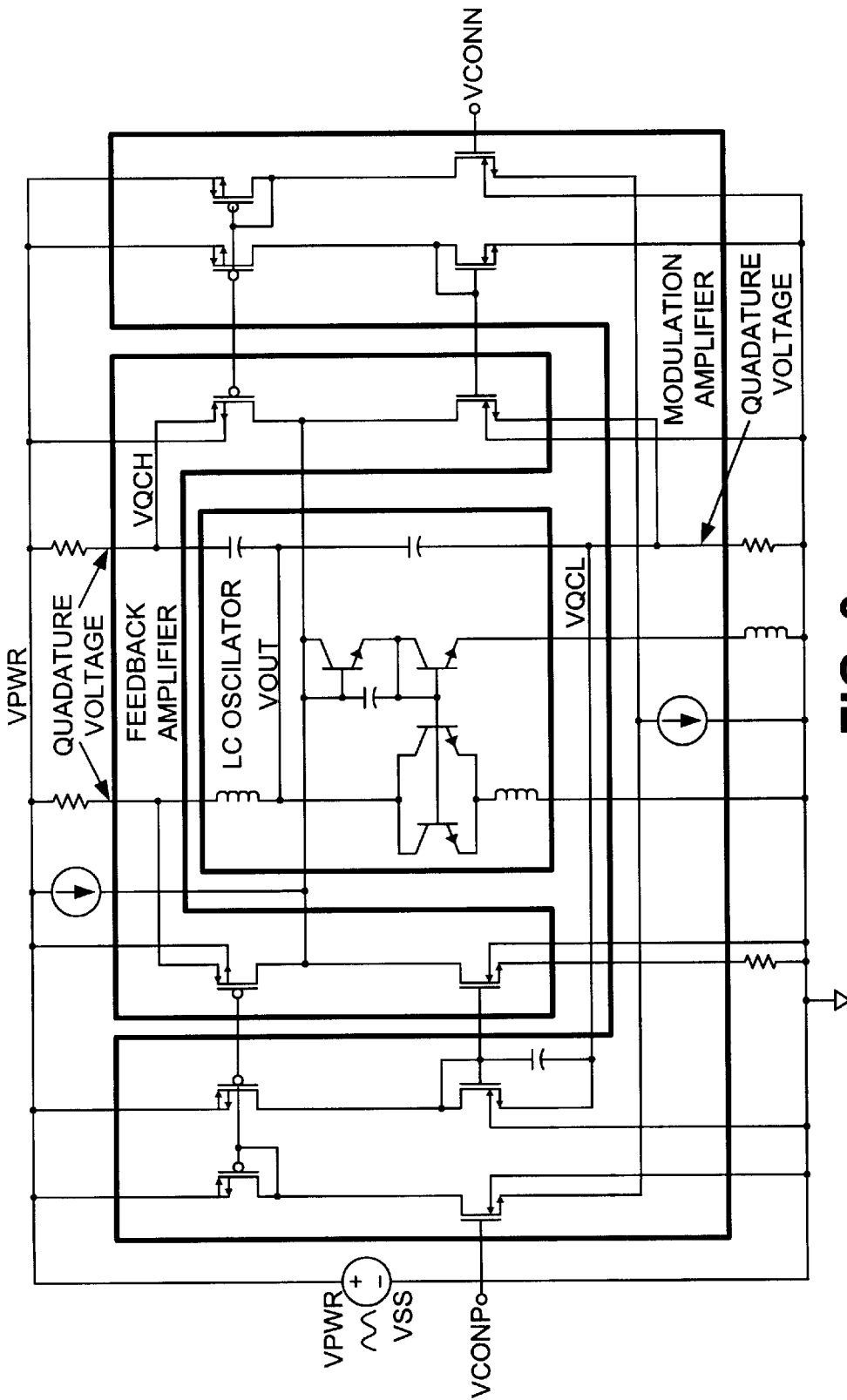
FIG. 3 an alternate embodiment of the present invention where the modulator is primarily CMOS.

FIG. 3 illustrates a similar implementation of the circuit of FIG. 1 with the implementation of complementary CMOS amplifiers. The CMOS amplifiers may have a gain that may be varied by changing the current differential in the feedback amplifiers and there by changing the $g_m$ of the transistors.

The present invention may be used to modulate other types of oscillators. For example, a ring oscillator may be modulated by using the quadrature signal of one stage to increase the rise and fall of an in-phase stage dependent on the magnitude of the modulation voltage.

Other methods may be used to vary the amount of quadrature signal feedback to modulate the frequency. For example, a threshold method may vary the time allowing a constant magnitude quadrature signal to be applied to the oscillator. Such an approach generally differ from the preferred embodiment of varying the magnitude of the quadrature signal over the entire cycle of oscillation. In another example, the modulation may be varied over part of the oscillator cycle by either of the methods described above.

The present invention may allow an unmodulated frequency to be almost totally dependent on the values of the passive reactive components, which are relatively stable. The modulation generally changes the deviation from the resonant frequency and is not required to center the VCO.

The present invention may use a quadrature signal to modulate an oscillator. The magnitude of the quadrature signal may be varied by controlling the gain gm of the feedback amplifier. The time a constant amplitude (i.e. some part of a sign wave) quadrature modulation signal is applied may also be varied. The time, a constant magnitude signal whose sign is equal or opposite to the sign of the slope of the in phase signal, may also be varied. The magnitude of the feedback quadrature signal may be varied by, controlling the proportion of the two out of phase quadrature signals.

The present invention may be useful in the generation of signals in the GHz frequency range. The present invention may be particularly useful in applications where an impedance of reasonable size may be implemented using on-chip inductors (e.g., a 5 turn inductor having an inductance of about 6 nH having a Q of 3 to 10 yielding an impedance of about 100 ohm at 2.5 GHz).

While the invention has been particularly shown and described with reference to the preferred embodiments thereof, it will be understood by those skilled in the art that various changes in form and details may be made without departing from the spirit and scope of the invention. For example, the circuits illustrated are all of a differential nature so as to reduce sensitivity to noise and the power or ground supplies as substrate noise. Single ended versions may be implemented, but will generally be more susceptible to noise.

What is claimed is:

1. A circuit comprising:
   an oscillator circuit configured to generate a first signal having a first frequency;
   a modulator circuit configured to modify said first frequency in response to a control signal; and
   a circuit configured to generate said control signal, wherein said control signal comprises a quadrature current.

2. The circuit according to claim 1, wherein said oscillator circuit comprises a LC oscillator circuit.

3. The circuit according to claim 1, wherein said oscillator circuit comprises a ring oscillator circuit.

4. The circuit according to claim 1, wherein said control signal comprises a quadrature current injected into an in-phase node of said oscillator circuit.

5. The circuit according to claim 4, wherein an in phase signal is added to the quadrature signal, to correct the phase shift in a modulation signal path, so as to generate a true +/−90° phase of the injected currents.

6. The circuit according to claim 1, wherein said control signal is generated in response to a first control voltage and a second control voltage.

7. The circuit according to claim 6, wherein:
   said first frequency decreases when said first control voltage is greater than said second control voltage;
   said first frequency increases when said first control voltage is less than said second control voltage; and
   said first frequency remains unchanged when said first control voltage is equal to said second control voltage.

8. The circuit according to claim 4, wherein said oscillator circuit further comprises a number of reactive element(s) configured to generate a quadrature current and produce said quadrature signal.

9. The circuit according to claim 8, wherein said quadrature current is generated in response to a current selected from the group consisting of a capacitor current, an inductor current, and a combined capacitor/inductor current.

10. The circuit according to claim 8, wherein said quadrature signal is detected from said reactive elements in a first stage and is injected into a second in-phase stage.

11. The circuit according to claim 4, wherein said quadrature signal is amplitude modulated with said control signal.

12. The circuit according to claim 4, wherein said quadrature signal is amplitude modulated with said control signal using a first and a second quadrature signal (+90° and −90°) combined through cross coupled differential amplifiers whose gains are varied with said control signal.

13. The circuit according to claim 4, wherein said quadrature signal is amplitude modulated with said control signal using a first and a second quadrature signal (+90° and −90°)

combined through cross coupled bipolar differential amplifiers whose gains are varied with said control signal.

14. The circuit according to claim 4, wherein said quadrature signal is amplitude modulated with said control signal using a first and a second quadrature signal (+90° and −90°) combined through cross coupled MOS differential amplifiers whose gains are varied with said control signal.

15. The circuit according to claim 4, wherein said quadrature signal is amplitude modulated with said control signal using a first and a second quadrature signal (+90° and −90° degree) combined through complementary MOS transistors whose gains are varied with said control signal.

16. The circuit according to claim 4, wherein said quadrature signal is amplitude modulated with said control signal using a first and a second quadrature signal (+90° and −90° degree) combined through a device selected from the group consisting of a differential junction field effect transistor, a differential N-channel MOS transistor, and a differential p-channel MOS transistor, wherein the gain of the selected device is varied with said control signal.

17. A method for modifying the frequency of oscillation of an oscillator comprising the steps of:

(A) generating a periodic signal having a first frequency;

(B) generating a control signal comprising a quadrature current; and (C) modifying said periodic signal in response to said control signal.

18. The method of claim 17, where said periodic signal is generated in response to an LC oscillator.

19. The method of claim 17, where said periodic signal is generated in response to a ring oscillator.

20. A circuit comprising:

an oscillator circuit configured to generate a first signal having a first frequency;

a modulator circuit configured to modify said first frequency in response to a control signal; and a circuit configured to generate said control signal in response to a first control voltage and a second control voltage, wherein (i) said first frequency decreases when said first control voltage is greater than said second control voltage, (ii) said first frequency increases when said first control voltage is less than said second control voltage, and (iii) said first frequency remains unchanged when said first control voltage is equal to said second control voltage.

* * * * *